(12) United States Patent
Shiozawa et al.

(10) Patent No.: US 8,759,929 B2
(45) Date of Patent: Jun. 24, 2014

(54) SOLID-STATE IMAGING DEVICE

(75) Inventors: Kazufumi Shiozawa, Kanagawa-ken (JP); Yusaku Konno, Kanagawa-ken (JP); Naotada Okada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 12/726,938

(22) Filed: Mar. 18, 2010

(65) Prior Publication Data

US 2010/0244168 A1 Sep. 30, 2010

(30) Foreign Application Priority Data

Mar. 24, 2009 (JP) ................. 2009-072918

(51) Int. Cl.
*H01L 31/0232* (2014.01)

(52) U.S. Cl.
USPC 257/432; 257/98; 257/E31.127; 257/E33.074

(58) Field of Classification Search
USPC ............... 257/432, E31.127, 98, E33.074
See application file for complete search history.

(56) References Cited

U.S. PATENT DOCUMENTS

2008/0315074 A1* 12/2008 Konno et al. ............ 250/214 R

FOREIGN PATENT DOCUMENTS

| JP | 2005-101109 | 4/2005 |
| JP | 2007-282054 | 10/2007 |
| JP | 2007-317859 | 12/2007 |
| JP | 2008-53627 | 3/2008 |
| JP | 2009-25558 | 2/2009 |
| WO | WO 2008/123461 A1 | 10/2008 |

OTHER PUBLICATIONS

Japanese Office Action issued May 30, 2012 in patent application No. 2009-072918 with English translation.
Japanese Office Action issued Feb. 29, 2012 in patent application No. 2009-072918 with English translation.
U.S. Appl. No. 13/601,165, filed Aug. 31, 2012, Kokubun et al.

* cited by examiner

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

A solid-state imaging device includes: a substrate including a plurality of light receiving sections; and a color filter including a guided-mode resonant grating provided immediately above each of the plurality of light receiving sections, at least one of an upper surface and a lower surface of the guided-mode resonant grating being covered with a layer having a lower refractive index than the guided-mode resonant grating.

14 Claims, 13 Drawing Sheets

Blue:h=0.04, d=0, W=0.16(μm)
Green:h=0.04, d=0.1, W=0.12(μm)
Red:h=0.1, d=0, W=0.16(μm)

$N_{Si}$ =4.14   $K_{Si}$ =0.043
$N_{SiO_2}$ =1.45

US 8,759,929 B2

SOLID-STATE IMAGING DEVICE

CROSS-REFERENCE TO RELATED APPLICATIONS

This application is based upon and claims the benefit of priority from the prior Japanese Patent Application No. 2009-72918, filed on Mar. 24, 2009; the entire contents of which are incorporated herein by reference.

BACKGROUND

1. Field

Embodiments of the invention relate generally to a solid-state imaging device.

2. Background Art

Solid-state imaging devices have recently been finding widespread application not only in digital cameras, but also in cell phones and various other mobile terminals, surveillance cameras, and web cameras for chatting through the Internet.

Such solid-state imaging devices are required to achieve low power consumption and small size. As a solid-state imaging device satisfying these requirements, a CMOS (complementary metal oxide semiconductor) area sensor (hereinafter referred to as CMOS sensor), a CCD (charge-coupled device) area sensor, or the like is drawing attention.

In an example of the CMOS sensor, a light receiving section made of a photodiode or the like is formed in the surface portion of a silicon substrate, and a multilayer wiring layer is formed on the silicon substrate outside the light receiving section (see, e.g., JP-A 2007-317859 (Kokai)).

In this type of solid-state imaging device, a microlens for focusing light and a pigment color filter made of organic resin for transmitting light only in a particular wavelength range are provided above the light receiving section. On the other hand, the miniaturization of solid-state imaging devices is advancing rapidly to achieve higher resolution.

SUMMARY

According to an aspect of the invention, there is provided a solid-state imaging device including: a substrate including a plurality of light receiving sections; and a color filter including a guided-mode resonant grating provided immediately above each of the plurality of light receiving sections, at least one of an upper surface and a lower surface of the guided-mode resonant grating being covered with a layer having a lower refractive index than the guided-mode resonant grating.

DETAILED DESCRIPTION

Embodiments of the invention will now be described with reference to the drawings.

First Embodiment

Figure 1:
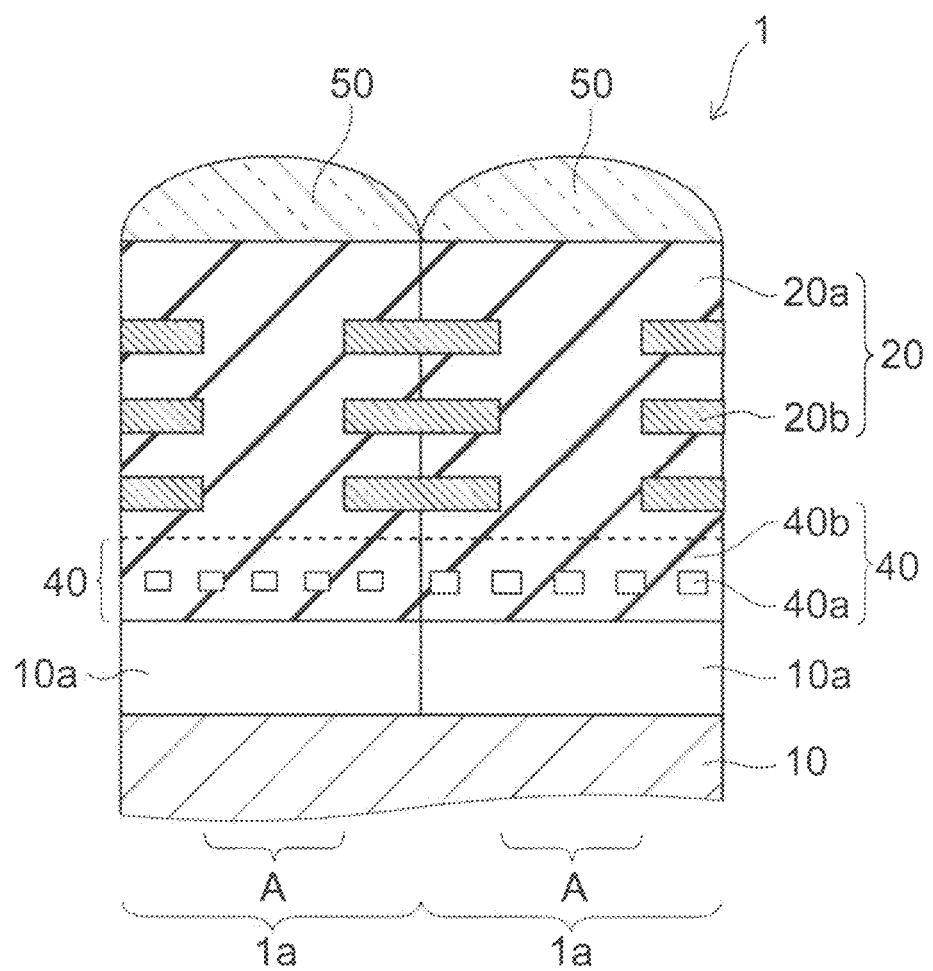
FIG. 1 is a schematic cross-sectional view of the relevant part of a solid-state imaging device according to an embodiment of the invention.

FIG. 1 is a schematic cross-sectional view of the relevant part of a solid-state imaging device according to an embodiment of the invention.

In a solid-state imaging device 1, a silicon (Si) substrate 10 is used as its base material, and a photodiode (PD) 10a serving as a light receiving section is formed in part of the surface portion of the silicon substrate 10. A PN junction, for instance, is formed inside such a photodiode 10a.

The photodiode 10a is shaped like a square, for instance, as viewed in a direction perpendicular to the major surface of the silicon substrate 10. A plurality of photodiodes 10a are arranged in a matrix (such as a grid or honeycomb) in the plane of the solid-state imaging device 1 (not shown).

In addition, the diffusion layer of the CCD or CMOS transistor serving as a charge transfer section is formed in the silicon substrate 10 (not shown).

Furthermore, the solid-state imaging device 1 includes a multilayer wiring layer 20 above the silicon substrate 10. The multilayer wiring layer 20 includes an interlayer insulating film 20a having insulation capability, and wirings 20b are arranged in multiple layers in this interlayer insulating film 20a. These wirings 20b function also as a light shielding film. However, the wirings 20b are not disposed in the region A in FIG. 1.

Furthermore, in the solid-state imaging device 1, a color filter 40 including a guided-mode resonant grating 40a (hereinafter, grating section 40a) is placed immediately above the photodiode 10a. This color filter 40 has a configuration, which includes a grating section 40a placed therein and an insulating layer 40b covering the upper and lower surface of the grating section 40a. The color filter 40 is sandwiched between the multilayer wiring layer 20 and the photodiode 10a. By placing this color filter 40 on the photodiode 10a, light of a particular wavelength is injected into the photodiode 10a.

Furthermore, in the solid-state imaging device 1, a microlens 50 in the form of a convex lens for focusing light is placed on the multilayer wiring layer 20.

It is noted that the solid-state imaging device 1 may include a dedicated light shielding film in the multilayer wiring layer 20 (not shown). Furthermore, a transfer electrode for transfer to the charge transfer section may be formed in the multilayer wiring layer 20 (not shown).

The width of each solid-state imaging element 1a (the width in a direction generally parallel to the major surface of the silicon substrate 10) constituting the solid-state imaging device 1 is approximately 1.4 μm. The pitch of the photodiodes 10a arranged in the multilayer wiring layer 20 is approximately 1.4 μm, and the thickness of the color filter 40 is e.g. 0.2 μm.

The thickness of the multilayer wiring layer 20 is e.g. 2 to 3 μm, and the thickness of the microlens 50 is e.g. approximately 0.5 μm.

The material used for the interlayer insulating film 20a is illustratively an insulating material such as $SiO_2$ (with a refractive index of approximately 1.45).

The material used for the wiring 20b is illustratively a high melting temperature metal such as copper (Cu), titanium (Ti), molybdenum (Mo), and tungsten (W), or a silicide of a high melting temperature metal such as TiSi, MoSi, and WSi.

The material used for the grating section 40a of the color filter 40 is illustratively a semiconductor material such as silicon (Si), or a nitride such as silicon nitride (SiN). In particular, the grating section 40a composed primarily of silicon (Si) serves as a high refractive index layer including a diffraction grating. The material used for the insulating layer 40b of the color filter 40 is illustratively $SiO_2$, a material having a lower refractive index than the grating section 40a.

Next, the function of the color filter 40 placed in the solid-state imaging device 1 is described.

Figure 2:
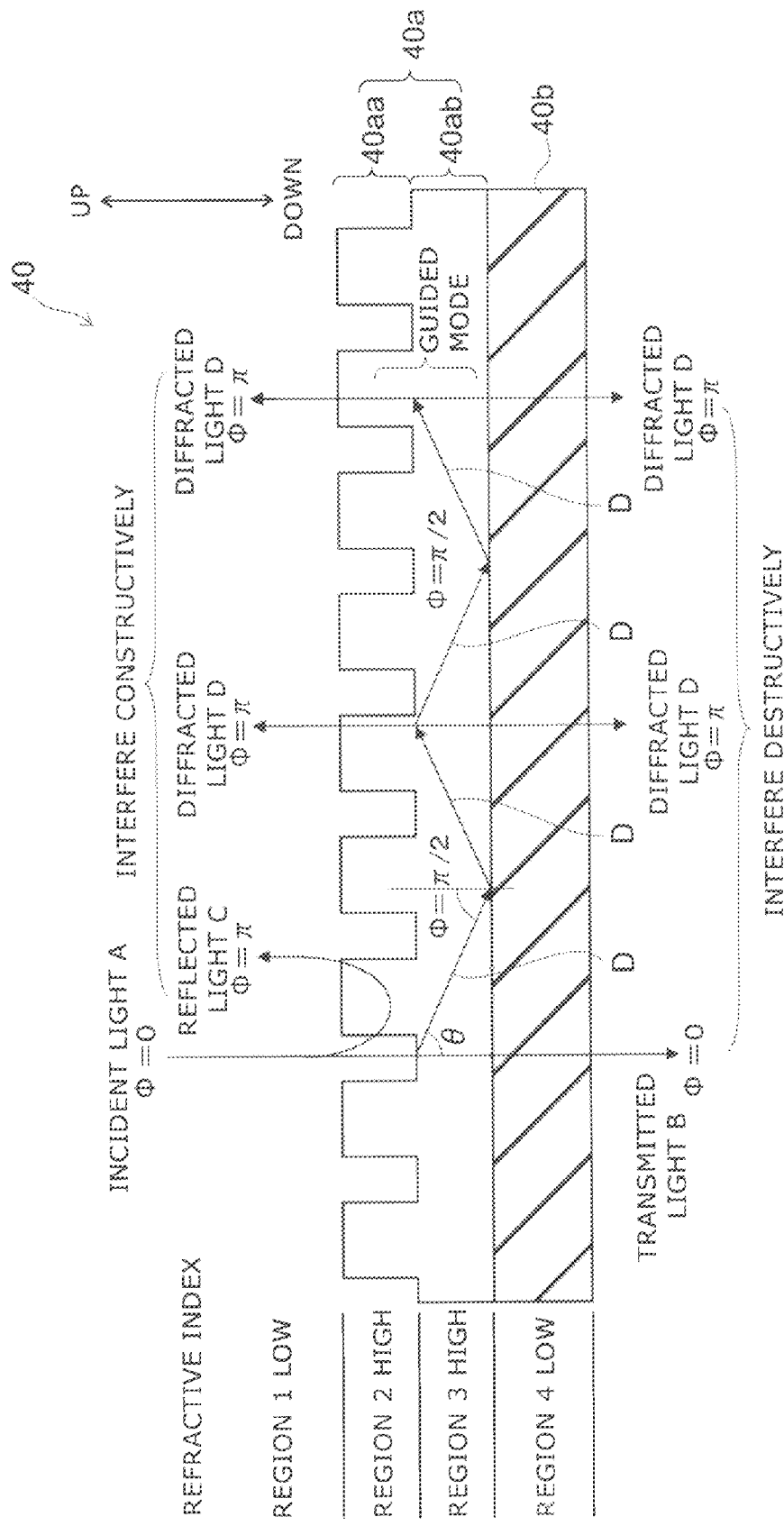
FIG. 2 is a schematic cross-sectional view of the relevant part for describing the function of a color filter including a guided-mode resonant grating.

FIG. 2 is a schematic cross-sectional view of the relevant part for describing the function of the color filter including a guided-mode resonant grating.

FIG. 2 illustrates the state in which the grating section 40a is placed on the insulating layer 40b.

The grating section 40a has a configuration, which includes a corrugated diffraction grating section 40aa periodically patterned with rectangular grooves and a planar section 40ab in contact with the diffraction grating section 40aa. The region layer above the grating section 40a is referred to as region 1, the region layer of the diffraction grating section 40aa is referred to as region 2, the region layer of the planar section 40ab is referred to as region 3, and the region layer of the insulating layer 40b is referred to as region 4. Then, in this configuration, the regions 2 and 3 have a higher refractive index than the regions 1 and 4. The region 1 may illustratively be a vacuum or air layer.

When light is incident on such a color filter 40, the phase of light obeys the following rules.

(1) No phase shift occurs in the transmitted light upon incidence from a low refractive index layer on a high refractive index layer (or incidence from a high refractive index layer on a low refractive index layer).

(2) A phase shift of $\pi$ occurs in the phase $\phi$ of light reflected by the grating section back to the region 1.

(3) A phase shift of $\pi/2$ occurs in the phase $\phi$ of light upon diffraction by the grating section.

Hence, assuming that the incident light A (wavelength $\lambda$) has a phase of $\phi=0$, the transmitted light B has a phase of $\phi=0$, and the reflected light C has a phase of $\phi=\pi$.

The phase of diffracted light D diffracted by the diffraction grating section 40aa is $\phi=\pi/2$ according to the above rules. Furthermore, when the diffracted light D is guided in the grating section 40a and again incident on the diffraction grating section 40aa, part of it is newly diffracted upward and downward from the grating section 40a. The diffracted light D consequently has a phase of $\phi=\pi$. Furthermore, guiding in the grating section 40a is repeated, and the diffracted light D, which is again diffracted upward and downward from the grating section 40a by the diffraction grating section 40aa, has a phase of $\phi=\pi$.

Hence, the light emitted downward from the color filter 40 is a mixture of the transmitted light B with a phase of $\phi=0$ and the diffracted light D with a phase of $\phi=\pi$, which thereby interfere destructively with each other. On the other hand, all the light beams emitted upward from the color filter 40 have a phase of $\phi=\pi$, and thereby interfere constructively with each other.

Thus, transmission of the incident light A of wavelength $\lambda$ is suppressed (blocked) in the color filter 40 if the diffracted light diffracted by the grating section 40a satisfies the condition of total reflection in the grating section 40a and satisfies the guided mode.

Such blocking of light is achieved when the wavelength of incident light, the refractive index of the regions 1 to 4, the pitch and height of the diffraction grating section 40aa, the width of the protrusion of the diffraction grating section 40aa, the height of the planar section 40ab and the like are matched under a particular condition. In other words, these parameters can be suitably adjusted so that the color filter 40 can transmit or reflect light of a particular wavelength.

Such a color filter 40 can be easily slimmed down because the grating section 40a primarily contributing to reflection and transmission of light has a two-dimensional planar configuration.

In the solid-state imaging device 1 shown in FIG. 1, a layer made of the same material as the region 4 is formed in part of the region 1. Such a structure also exhibits a function similar to that of the color filter 40 illustrated in FIG. 2 because the region 1 has a lower refractive index than the regions 2 and 3.

Next, the effect of the color filter 40 is described.

Figure 3A:
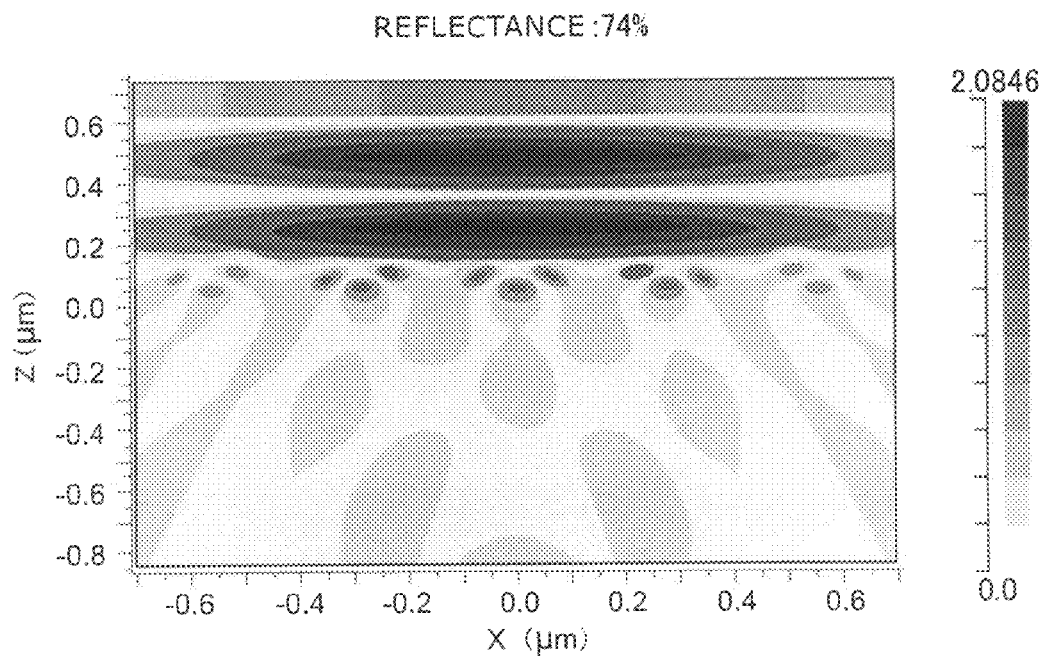
FIGS. 3A and 3B illustrate the effect of the color filter.
Figure 3B:
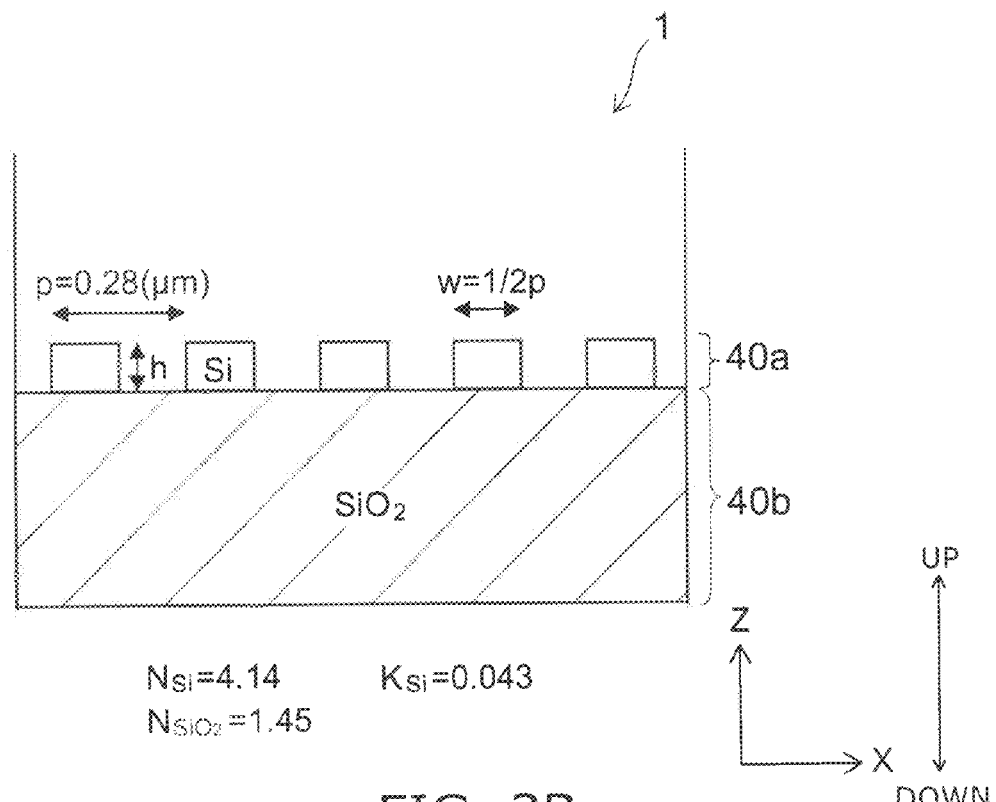

FIGS. 3A and 3B illustrate the effect of the color filter. Here, FIG. 3A shows a simulation result for light intensity in which light having a wavelength of 530 nm is injected into the color filter 40, where the darker shade in FIG. 3A represents a higher light intensity at the corresponding position. The simulation is based on the FDTD (finite-difference time-domain) method. FIG. 3B shows the model structure of the color filter 40 used in this simulation. The horizontal axis in FIG. 3A represents the dimension (μm) of the model in the horizontal direction (X-axis direction in FIG. 3B), and the vertical axis represents the dimension (μm) of the model in the vertical direction (Z-axis direction in FIG. 3B). In this simulation, calculation is performed under the PML (perfectly matched layer) condition at both ends of the model.

The model shown in FIG. 3B includes a line-and-space grating section 40a and an insulating layer 40b placed therebelow, and the region above (in the Z-axis direction) the grating section 40a is an air layer. Here, the width (X-axis direction) of the model is 1.4 μm. The material of the grating section 40a is illustratively a semiconductor material such as silicon (Si), with the refractive index N being N=4.14 and the absorptance K being 0.043. The material of the insulating layer 40b is illustratively silicon oxide ($SiO_2$), with the refractive index N being N=1.45.

In the grating section 40a as shown in FIG. 3B, the height d of the aforementioned planar section 40ab is d=0 μm. The height h of the diffraction grating section 40aa is h=0.05 μm, the pitch p of the protrusions of the diffraction grating section 40aa is 0.28 μm, and the width of the protrusion is half the pitch.

The position of 0 μm on the vertical axis of FIG. 3A corresponds to the upper surface of the insulating layer 40b.

It was found that when light having a wavelength of 530 nm, for instance, is injected from above into such a color filter 40, a portion with a dark shade exists above the color filter 40, rather than therebelow, as shown in FIG. 3A. That is, it was found that the color filter 40 has the effect of reflecting light. The reflectance was 74% from the simulation result.

Here, if silicon nitride (SiN, with a refractive index of 1.9) having a lower refractive index than silicon is used for the material of the grating section 40a, the value of the calculated reflectance is at most approximately 10%, failing to achieve the function of the color filter. This is because the number of grating elements, which can be placed within the pixel pitch, 1.4 µm, is approximately five, which results in a weak interaction between the light and the grating. Hence, a material (such as silicon) having a higher refractive index than silicon nitride is preferably used in the grating section 40a to strengthen the interaction between the light and the grating.

Figure 4:
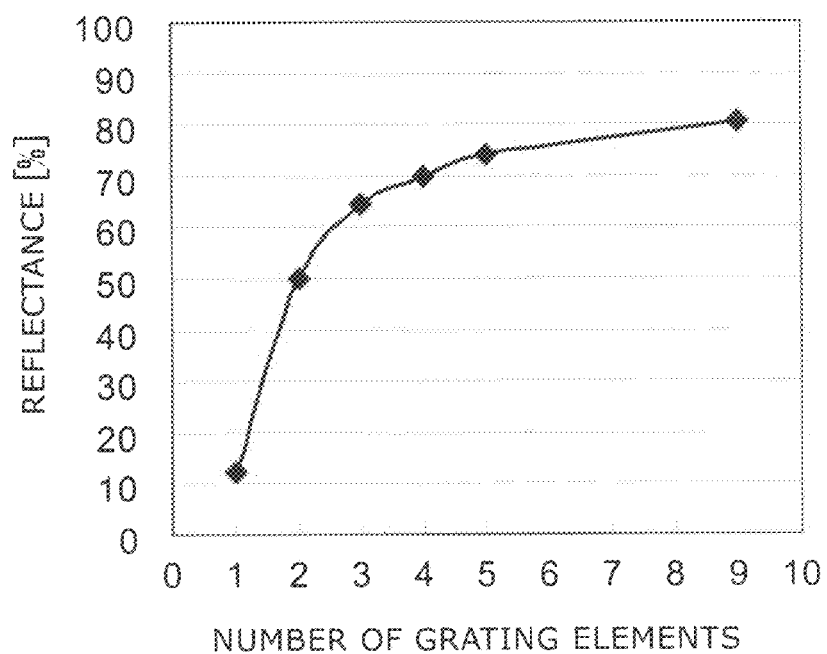
FIG. 4 illustrates the effect of the color filter.

FIG. 4 illustrates the effect of the color filter. Here, FIG. 4 shows a simulation result for reflectance by the FDTD method. The horizontal axis of FIG. 4 represents the number of protrusions in the model shown in FIG. 3B, which corresponds to the number of grating elements in the diffraction grating. The vertical axis represents the reflectance (%) of light reflected by the color filter 40. In this simulation, calculation is performed under the PML (perfectly matched layer) condition at both ends of the model.

As seen from the result of FIG. 4, when the number of protrusions in the diffraction grating section 40aa was one, the reflectance of light ($\lambda$=530 nm) was 13%. The reflectance was 50% for two protrusions, 65% for three protrusions, and 70% for four protrusions. Furthermore, it was found that the reflectance was 74% or more for five or more protrusions.

That is, it is preferable that five or more protrusions be periodically formed in the diffraction grating section 40aa of the color filter 40 to increase the reflectance of the color filter 40.

Furthermore, as described above, the reflectance of the color filter 40 is determined by suitably adjusting the wavelength of incident light, the refractive index of each portion, the pitch and height of the diffraction grating section 40aa, the width of the protrusion of the diffraction grating section 40aa, the height of the planar section 40ab and the like.

Figure 5A:
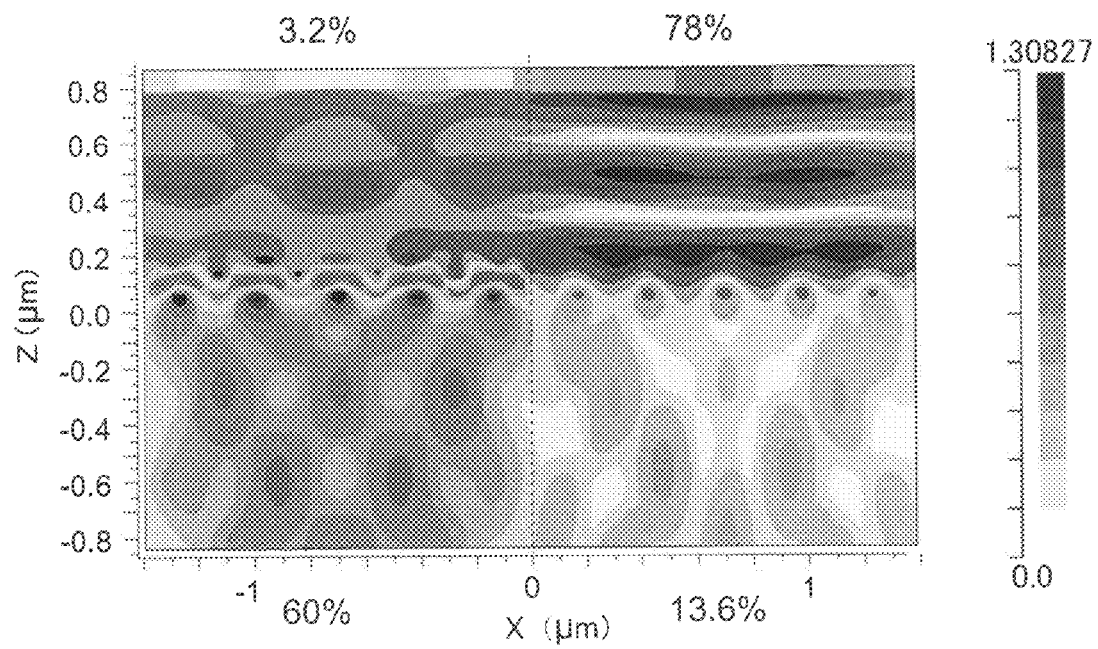
FIGS. 5A and 5B illustrate the effect of the color filter.
Figure 5B:
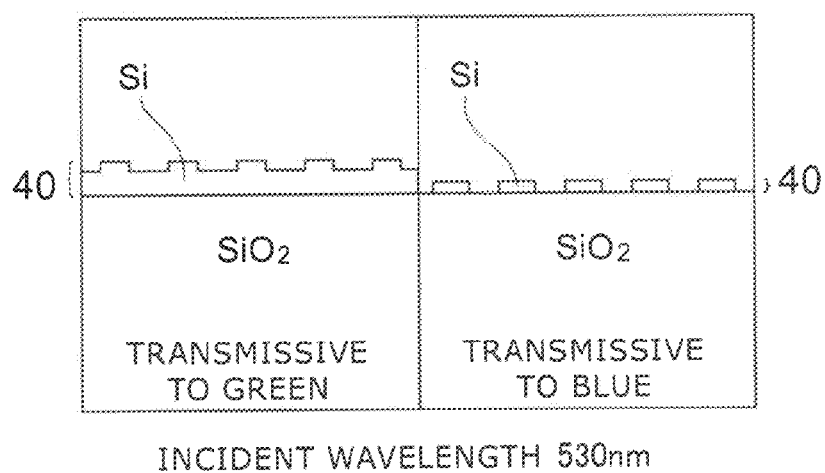

For instance, FIGS. 5A and 5B illustrate the effect of the color filter. Here, FIG. 5A shows a simulation result for light intensity in which light having a wavelength of 530 nm is injected into the color filter 40, where the darker shade in FIG. 5A represents a higher light intensity at the corresponding position. The simulation is based on the FDTD method. FIG. 5B shows a model structure in which two color filters 40 are juxtaposed. The right-side model shows a model lacking the planar section 40ab of the grating section 40a, and the left-side model shows a model including the planar section 40ab. In this simulation, calculation is performed under the Period (periodic) condition at both ends of the model.

It was found from these results that the reflectance of light ($\lambda$=530 nm) depends on whether the grating section 40a includes the planar section 40ab. For instance, in the right-side model of FIG. 5B, the light intensity is relatively high above the color filter 40, with a light reflectance of 78% and a transmittance of 13.6%. In the left-side model of FIG. 5A, the light intensity is relatively high below the color filter 40, with a light reflectance of 3.2% and a transmittance of 60%.

Thus, the reflectance and transmittance of light of a particular wavelength can be varied by changing the configuration of the color filter 40.

Figure 6A:
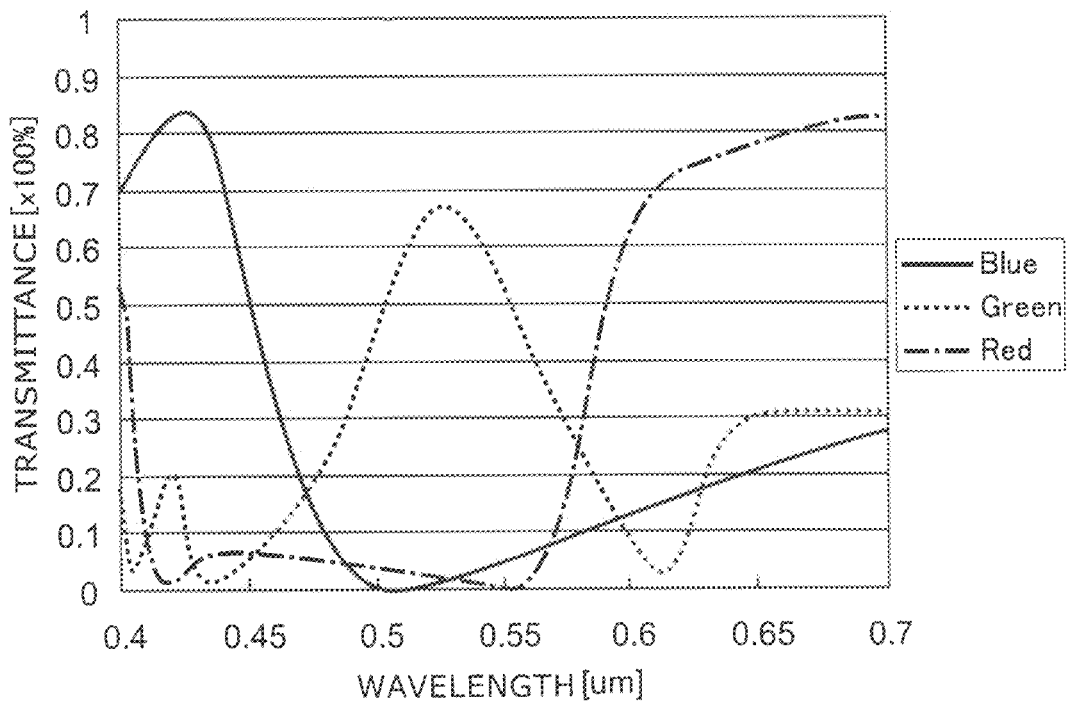
FIGS. 6A and 6B illustrate the effect of the color filter.
Figure 6B:
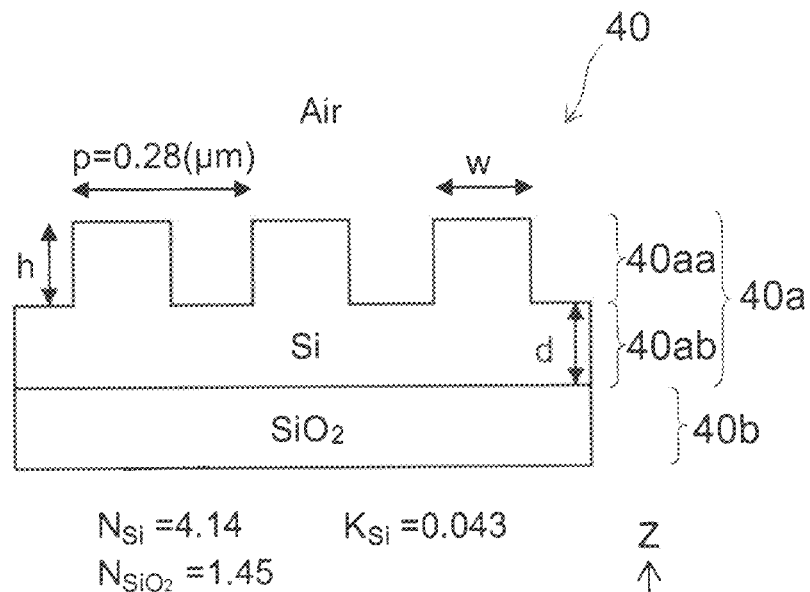

Furthermore, FIGS. 6A and 6B show a result of detailed simulation for the effect of blocking light by the color filter 40.

FIGS. 6A and 6B illustrate the effect of the color filter. Here, the horizontal axis of FIG. 6A represents the wavelength (µm) of light, and the vertical axis represents transmittance (%). The calculation of transmittance is based on the simulation by the RCWA (rigorous coupled wave analysis) method. FIG. 6B shows the model structure of the color filter 40 used in this simulation. In this simulation, bearing in mind that a plurality of pixels are arranged horizontally, calculation is performed under the Period (periodic) condition at both ends of the model.

For instance, the model shown in FIG. 6B includes a line-and-space grating section 40a and an insulating layer 40b placed therebelow, and the region above (in the Z-axis direction) the grating section 40a is an air layer. Here, the horizontal (X-axis direction) period or pitch p of the model is 0.28 µm. The material of the grating section 40a is illustratively silicon (Si), with the refractive index N being N=4.14 and the absorptance K being 0.043. The material of the insulating layer 40b is illustratively silicon oxide ($SiO_2$), with the refractive index N being N=1.45.

In the grating section 40a, the height of the aforementioned planar section 40ab is d (µm). The height of the diffraction grating section 40aa is h (µm), and the width of the protrusion of the diffraction grating section 40aa is W.

For instance, as shown in FIG. 6A, for h=0.04 µm, d=0 µm, and W=0.16 µm, it was found that the transmittance of light primarily in the blue wavelength range is high.

For h=0.04 µm, d=0.1 µm, and W=0.12 µm, it was found that the transmittance of light primarily in the green wavelength range is high.

For h=0.1 µm, d=0 µm, and W=0.16 µm, it was found that the transmittance of light primarily in the red wavelength range is high.

Thus, the transmittance of light of a particular wavelength can be varied by changing the configuration of the color filter 40. That is, light in a particular wavelength region can be injected into the photodiode 10a by placing such a color filter 40 immediately above the photodiode 10a.

However, the line-and-space color filter 40 described above may cause dependence on the polarization of light.

Figures 7A, 7B:
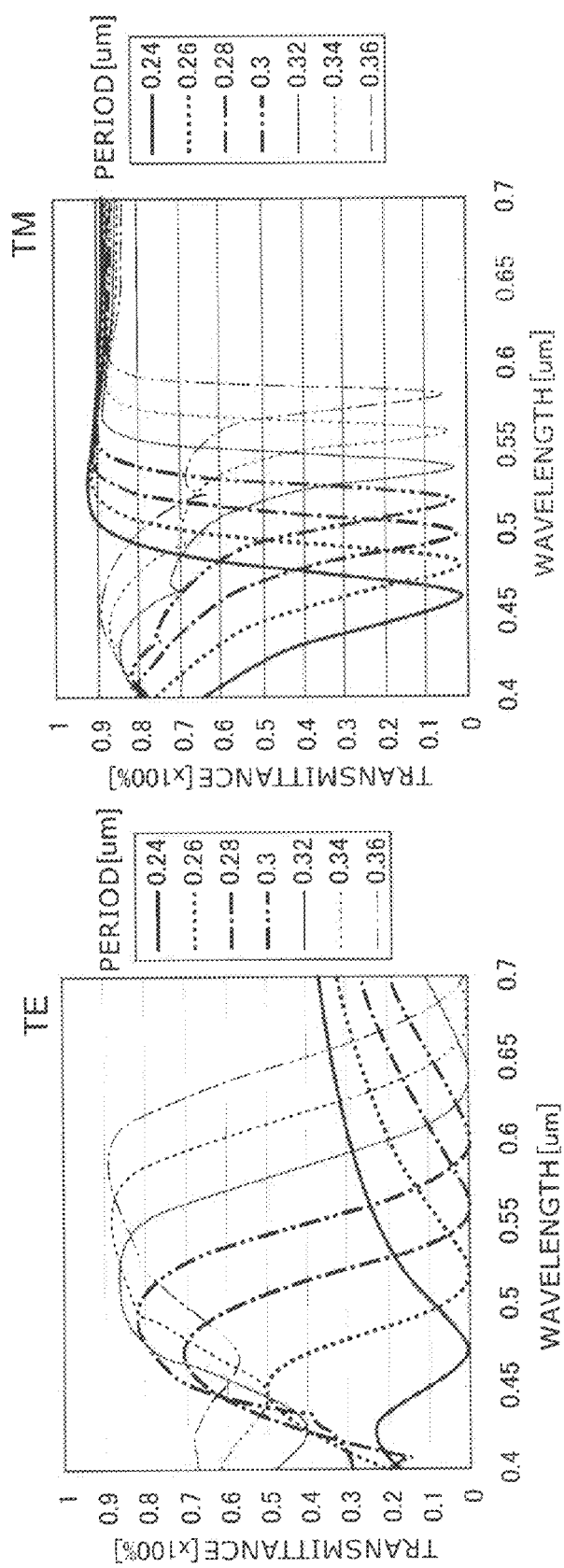
FIGS. 7A and 7B illustrate dependence on the polarization of light in a line-and-space guided-mode resonant grating.

FIGS. 7A and 7B illustrate dependence on the polarization of light in a line-and-space guided-mode resonant grating. Here, the horizontal axis of FIGS. 7A and 7B represents the wavelength (µm) of light, and the vertical axis represents transmittance (%). The calculation of transmittance is based on the simulation by the RCWA method. FIG. 7A shows transmittance for the case where light (referred to as TE) polarized parallel to the line (or space) of the line-and-space pattern is injected into the color filter 40, and FIG. 7B shows transmittance for the case where light (referred to as TM) polarized perpendicular to the line (or space) of the line-and-space pattern is injected into the color filter 40. Furthermore, the model shown in FIG. 6B is used with h=0.06 µm, d=0 µm, and W=0.16 µm. FIGS. 7A and 7B collectively show the transmittance with the pitch p varied.

As shown in FIGS. 7A and 7B, for the pitch p in the range of p=0.24 to 0.36 µm, a difference occurs in transmittance between TE and TM even at the same wavelength of light. Hence, use of a line-and-space guided-mode resonant grating imposes restrictions on the polarization of light incident on the solid-state imaging device 1.

Thus, besides the line-and-space grating section 40a described above, this embodiment proposes a dotted grating section 40a in which the grating is arranged like islands in a two-dimensional plane generally parallel to the major surface of the silicon substrate 10.

Figure 8:
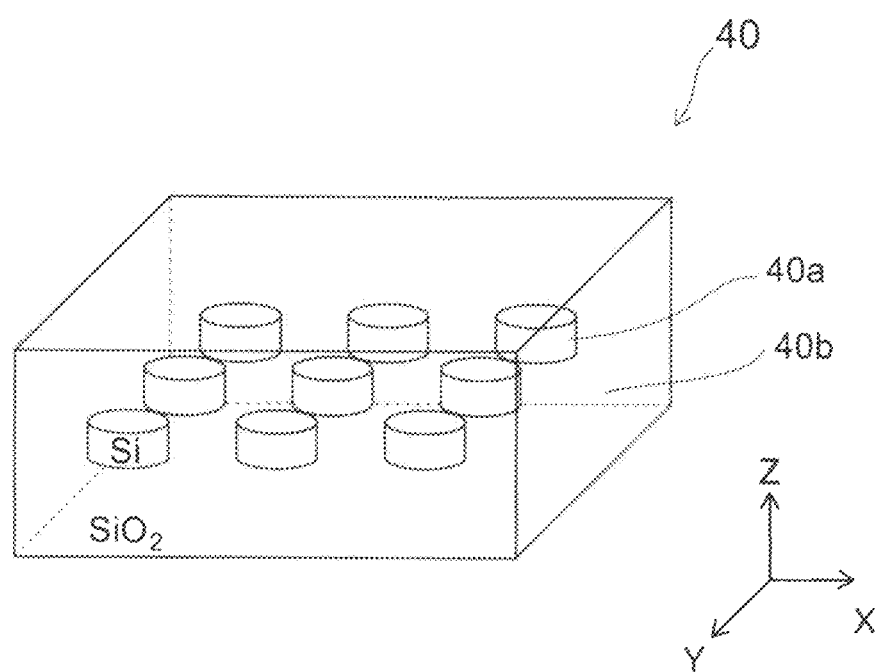
FIG. 8 is a schematic perspective view of the relevant part of a color filter according to the embodiment of the invention.

FIG. 8 is a schematic perspective view of the relevant part of a color filter according to the embodiment of the invention.

The color filter 40 as shown in FIG. 8 includes a dotted grating section 40a in an insulating layer 40b. In this grating section 40a, a plurality of diffraction grating elements, each being an independent island-like layer, are arranged in a grid (or lattice) in a two-dimensional plane. The material used for the grating section 40a is silicon (Si). Use of such a color filter 40 additionally achieves the following advantageous effect.

Figure 9A:
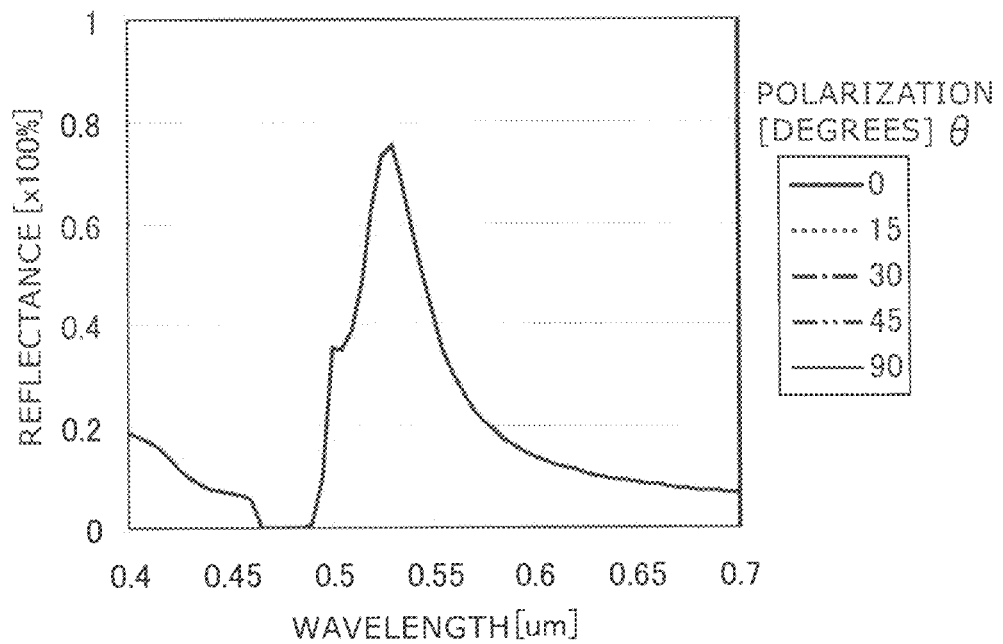
FIGS. 9A and 9B illustrate the effect of the color filter.
Figure 9B:
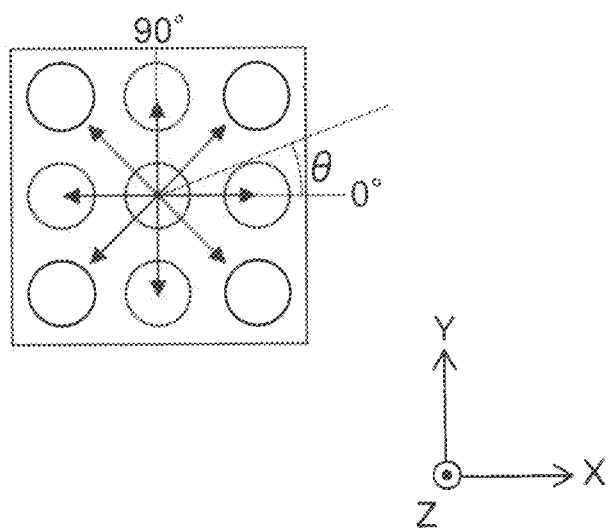

FIGS. 9A and 9B illustrate the effect of the color filter. Here, the horizontal axis of FIG. 9A represents the wavelength (μm) of light, and the vertical axis represents reflectance (%). The calculation of reflectance is based on the simulation by the RCWA method. FIG. 9B shows the polarization angle of light. That is, FIG. 9A shows reflectance for the polarization angle of light varied from the polarization of light parallel to the X-axis direction (θ=0°) to the polarization of light parallel to the Y-axis direction (θ=90°) in the case where the major surface of the silicon substrate 10 is placed generally parallel to the X-Y plane.

The result was that as shown in FIG. 9A, in the range of θ from 0° to 90°, the reflectance has no dependence on the polarization of light, and all the spectra coincide. That is, it was found that the reflectance of the color filter 40 has no dependence on the polarization of light.

The parameters in this simulation are as follows. The material of the grating section 40a is illustratively silicon (Si), with the refractive index N being N=4.14 and the absorptance K being 0.043. The material of the insulating layer 40b is illustratively silicon oxide (SiO$_2$), with the refractive index N being N=1.45. Furthermore, p=0.32 μm, h=0.06 μm, d=0 μm, and W=0.16 μm.

To suppress dependence on the polarization of light, as shown in FIG. 9B, it is preferable that the dotted grating section 40a be arranged in a grid and that the cross section of the grating section 40a in the X-Y plane be a circular shape. This is because in this configuration, the shape and pitch of the grating section 40a in the X-Y plane are the same for light polarized in the X-axis direction and light polarized in the Y-axis direction. If the grating section 40a has a polygonal major surface or is displaced from the grid-like layout, then besides the main peak occurring near 0.53 μm in FIG. 9A, an unwanted sub-peak may occur in the reflectance, which is undesirable.

Furthermore, the incident angle dependence of the color filter 40 including the dotted grating section 40a was also investigated. The parameters in this case are the same as those described with reference to FIGS. 9A and 9B.

Figure 10A:
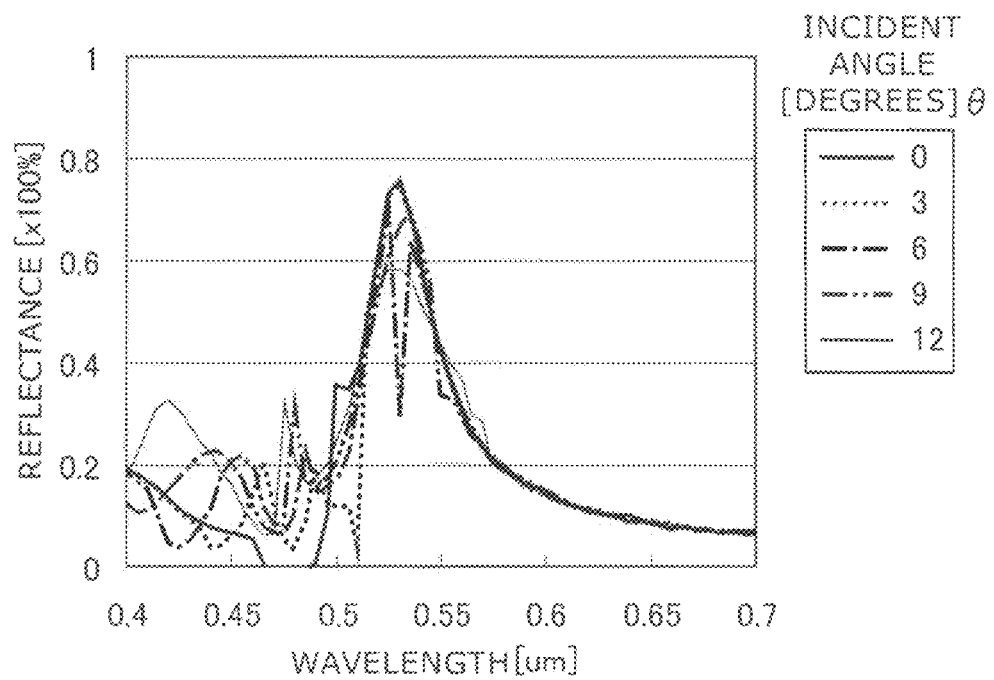
FIGS. 10A and 10B illustrate the effect of the color filter.
Figure 10B:
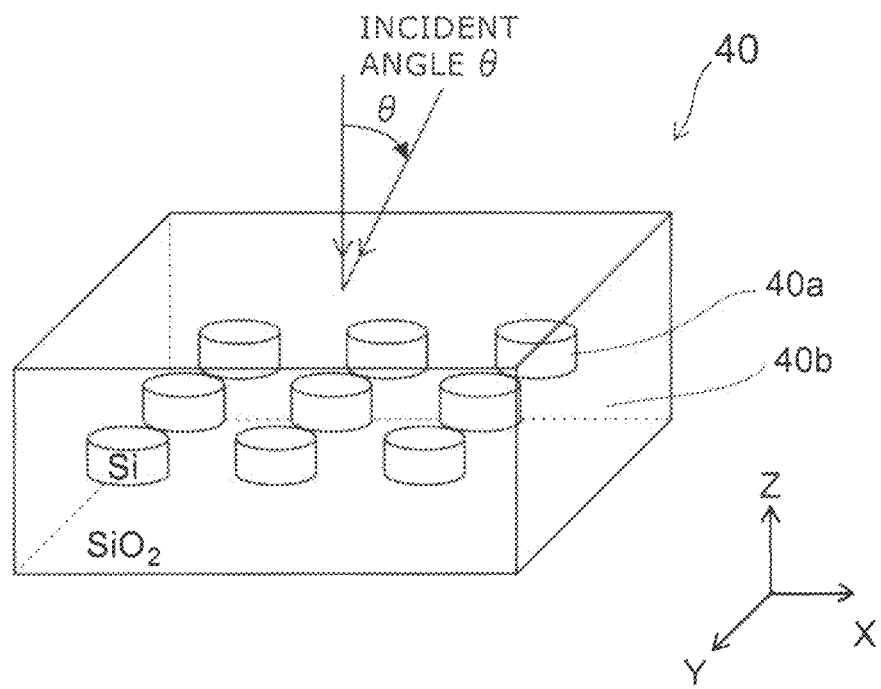

FIGS. 10A and 10B illustrate the effect of the color filter. Here, the horizontal axis of FIG. 10A represents the wavelength (μm) of light, and the vertical axis represents reflectance (%). The calculation of reflectance is based on the simulation by the RCWA method. FIG. 10B shows the incident angle θ of light. That is, FIG. 10A shows reflectance for the angle of light varied from the incidence of light parallel to the Z-axis direction (θ=0°) to θ=12° in the case where the major surface of the silicon substrate 10 is placed generally parallel to the X-Y plane.

The result was that as shown in FIG. 10A, in the range of incident angle θ from 0° to 12°, the reflectance substantially overlaps, and it was found that there is no incident angle dependence of reflectance.

Also in such a color filter 40 including the dotted grating section 40a, the refractive index of each portion, the pitch and height of the grating section 40a, the width of the protrusion of the grating section 40a and the like can be suitably adjusted so that light of a particular wavelength can be blocked by the color filter 40. One example is shown in FIG. 11.

Figure 11:
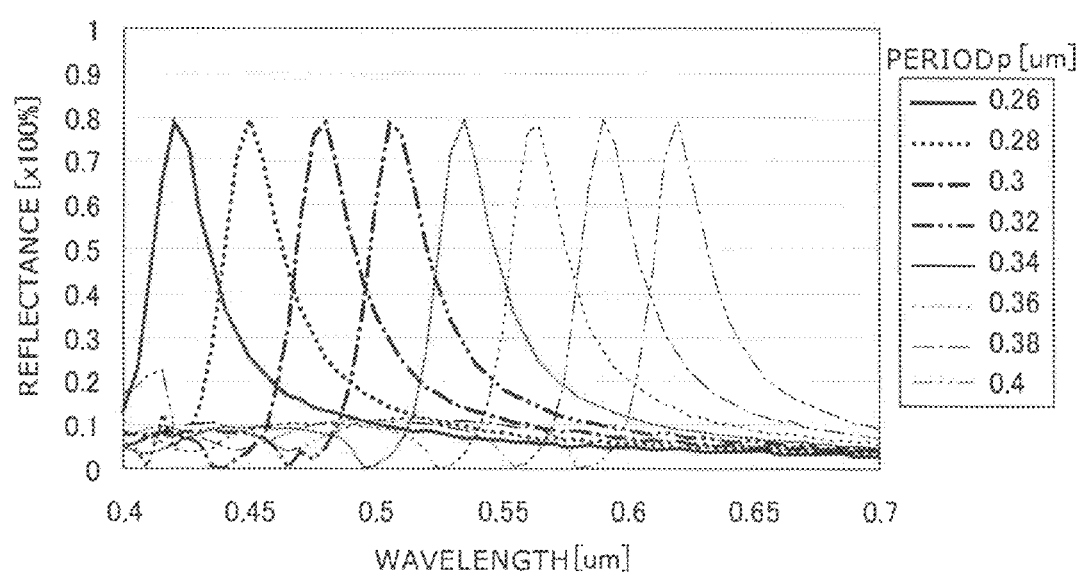
FIG. 11 illustrates the effect of the color filter.

FIG. 11 illustrates the effect of the color filter. Here, the horizontal axis of FIG. 11 represents the wavelength (μm) of light, and the vertical axis represents reflectance (%). The calculation of reflectance is based on the simulation by the RCWA method. FIG. 11 shows the variation of reflectance with the variation of the pitch p of the dotted grating section 40a.

The parameters in this simulation are as follows. The material of the grating section 40a is illustratively silicon (Si), with the refractive index N being N=4.14 and the absorptance K being 0.043. The material of the insulating layer 40b is illustratively silicon oxide (SiO$_2$), with the refractive index N being N=1.45. Furthermore, h=0.1 μm, d=0 μm, and W is half the pitch p.

As shown in FIG. 11, it was found that when the pitch p of the dotted grating section 40a is varied from 0.26 μm to 0.4 μm, the peak of reflectance varies with the wavelength of light. That is, light in a particular wavelength range can be selectively reflected by varying the pitch p, which is one of the parameters.

Thus, the solid-state imaging device 1 does not include a pigment color filter made of organic resin, but includes the aforementioned color filter 40 as a member for blocking light in a particular wavelength range. Furthermore, this color filter 40 is placed immediately above the photodiode 10a. Thus, in the solid-state imaging device 1, crosstalk is suppressed, and the light receiving efficiency of the solid-state imaging device is improved.

In contrast, the conventional pigment color filter requires a film thickness of approximately 0.7 to 0.8 μm to achieve a sufficient effect of blocking light. As the pitch of the solid-state imaging element 1a is reduced to a width of 2 μm or less, the aspect ratio of the pigment color filter further increases. Hence, the device configuration including the conventional pigment color filter cannot suppress crosstalk between pigment color filters.

However, in this embodiment, the color filter 40 is placed immediately above the photodiode 10a. Furthermore, its thickness is approximately 0.2 μm, and the aspect ratio is smaller. Hence, in the solid-state imaging device 1, crosstalk is suppressed, and the light receiving efficiency of the solid-state imaging device is improved. Thus, the solid-state imaging device 1 achieves higher resolution. Furthermore, because the thickness of the color filter 40 is approximately 0.2 μm, the solid-state imaging device 1 can be slimmed down.

Furthermore, because the color filter 40 is made of inorganic materials, the color filter 40 has high heat resistance and is less prone to degradation during the manufacturing process or prolonged use. Hence, the solid-state imaging device 1 with high reliability is realized.

Second Embodiment

Next, variations of the solid-state imaging device are described.

Figure 12A:
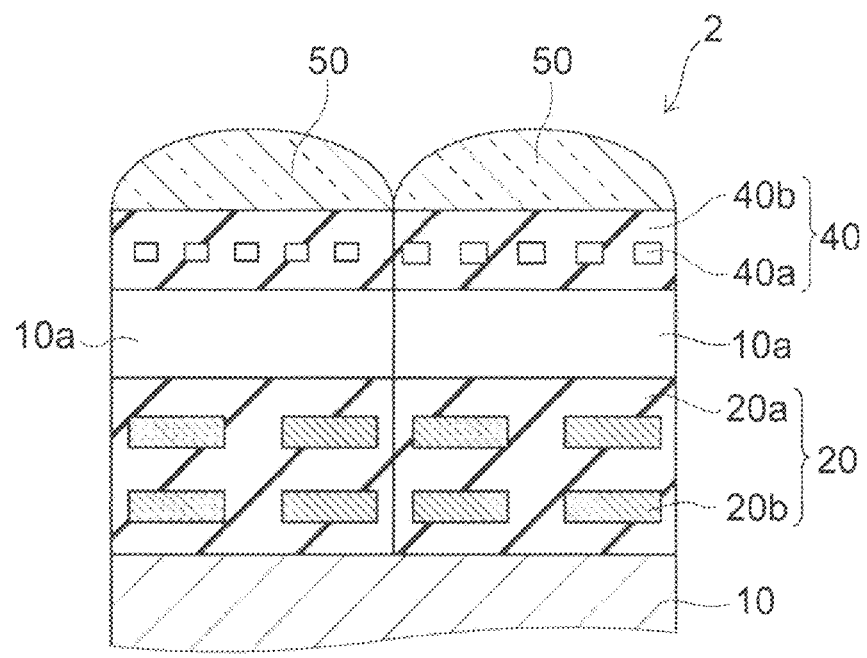
FIGS. 12A and 12B are schematic cross-sectional views of the relevant part of solid-state imaging devices according to the embodiment of the invention.
Figure 12B:
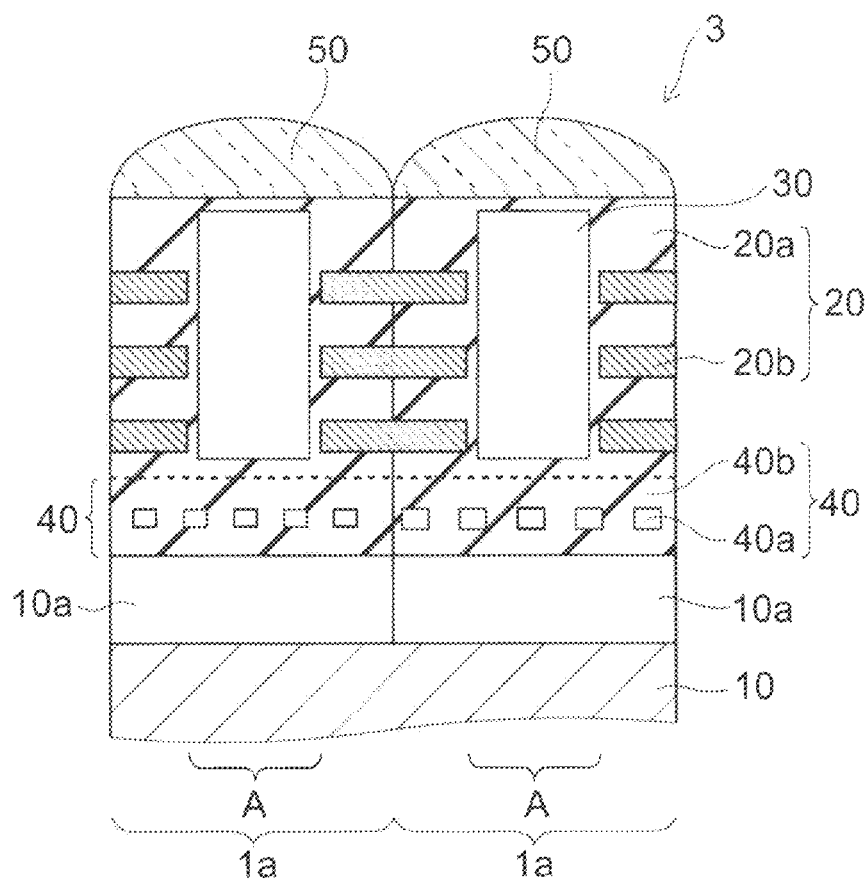

FIGS. 12A and 12B are schematic cross-sectional views of the relevant part of solid-state imaging devices according to the embodiment of the invention.

In a solid-state imaging device 2 shown in FIG. 12A, a silicon substrate 10 is used as its base material, and a multilayer wiring layer 20 is provided on the silicon substrate 10. The multilayer wiring layer 20 includes an interlayer insulating film 20a having insulation capability, and wirings 20b are arranged in multiple layers in this interlayer insulating film 20a. Furthermore, a photodiode 10a serving as a light receiving section is formed on the multilayer wiring layer 20.

In addition, the diffusion layer of the CCD or CMOS transistor serving as a charge transfer section is formed in the multilayer wiring layer 20 (not shown).

Furthermore, in the solid-state imaging device 2, a color filter 40 is placed immediately above the photodiode 10a. The color filter 40 has a configuration, which includes a grating section 40a placed therein and an insulating layer 40b covering the upper and lower surface of the grating section 40a.

Furthermore, in the solid-state imaging device 2, a microlens 50 in the form of a convex lens is placed immediately above the color filter 40. In other words, in the solid-state imaging device 2, the color filter 40 is placed immediately below the microlens 50 in the form of a convex lens.

In such a configuration, the light focused by the microlens 50 is directly incident on the color filter 40. That is, in the solid-state imaging device 2, the path of light from the microlens 50 to the photodiode 10a is shorter than that in the solid-state imaging device 1, and hence the light receiving efficiency is further improved. Furthermore, because the color filter 40 is placed immediately below the microlens 50, crosstalk is less likely to occur.

Furthermore, in the solid-state imaging device 2, the multilayer wiring layer 20 is placed below the photodiode 10a. This eliminates the effect of light shielding by the wirings 20b, and the pitch of the solid-state imaging device 2 can be further reduced.

Alternatively, as in a solid-state imaging device 3 shown in FIG. 12B, an optical waveguide 30 for guiding light may be provided in the interlayer insulating film 20a between the microlens 50 and the color filter 40. In such an optical waveguide 30, there are no members such as wirings, transfer electrodes, and light shielding films. In this case, the width of the optical waveguide 30 is e.g. approximately 1.0 µm. The material used for the optical waveguide 30 is illustratively a polymer-based organic material or silicon nitride (SiN) having a higher refractive index than the interlayer insulating film 20a. Alternatively, a focusing lens may be provided in this portion instead of the optical waveguide 30.

Third Embodiment

The configuration of the color filter 40 including the dotted grating section is not limited to the configuration shown in FIG. 8. In the following, variations of the color filter are described.

Figure 13A:
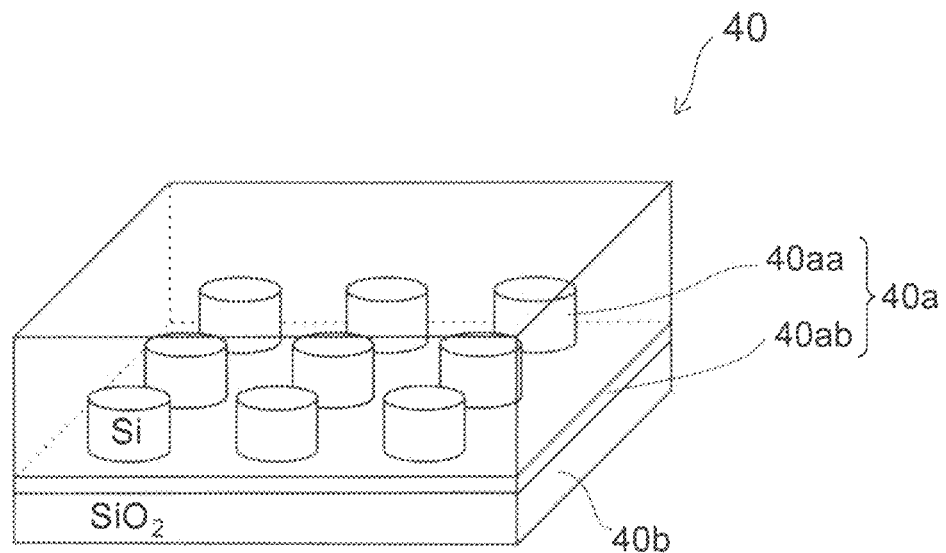
FIGS. 13A and 13B are schematic perspective views of the relevant part of a color filter according to the embodiment of the invention.
Figure 13B:
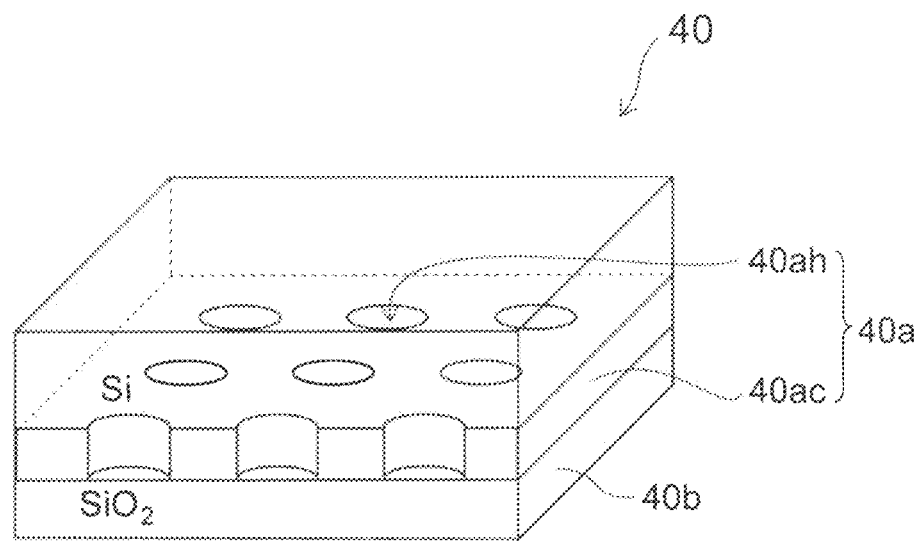

FIGS. 13A and 13B are schematic perspective views of the relevant part of a color filter according to the embodiment of the invention.

For instance, in the color filter 40 shown in FIG. 13A, a dotted grating section 40a is provided on an insulating layer 40b and further supported by a planar section 40ab. Such a color filter 40 may be incorporated in the solid-state imaging devices 1 and 2. In this case, the thickness d of the planar section 40ab is also included in the aforementioned parameters determining the reflectance (or transmittance) of the color filter 40.

To facilitate generation of the aforementioned guided modes, as shown in FIG. 13B, the color filter 40 may include a planar silicon plate 40ac including hole portions 40ah. These hole portions 40ah are a circular shape in the X-Y plane and arranged in a grid in the X-Y plane of the silicon plate 40ac. Such a color filter 40 may be incorporated in the solid-state imaging devices 1 and 2.

The embodiments of the invention have been described with reference to examples. However, the embodiments are not limited to these examples. That is, those skilled in the art can suitably modify the above examples, and such modifications are also encompassed within the scope of the invention as long as they fall within the spirit of the invention. For instance, various components of the above examples and their layout, material, condition, shape, size and the like are not limited to those illustrated, but can be suitably modified.

Furthermore, the components of the above embodiments can be combined with each other as long as technically feasible, and such combinations are also encompassed within the scope of the invention as long as they fall within the spirit of the invention.

Furthermore, those skilled in the art could conceive various modifications and variations within the spirit of the invention, which are also encompassed within the scope of the invention.

The invention claimed is:

1. A solid-state imaging device comprising:
a substrate including a light receiving section; and
a color filter provided directly on the light receiving section, the color filter including a guided-mode resonant grating, wherein
the guided-mode resonant grating includes dotted-like diffraction grating elements, the diffraction grating elements are periodically disposed in a first direction parallel to a major surface of the substrate and in a second direction parallel to the major surface of the substrate, and the second direction is perpendicular to the first direction, and a pitch of the diffraction grating elements is varied from 0.26 µm to 0.4 µm,
at least one of an upper surface and a lower surface of the guided-mode resonant grating is covered with a layer having a lower refractive index than the diffraction grating elements,
a first light in a particular wavelength range injected into the guided-mode resonant grating from the upper surface side transmits through the guided-mode resonant grating and reaches the light receiving section,
as for a second light except the first light in a particular wavelength range injected into the guided-mode resonant grating from the upper surface side,
a phase of the second light reflected by the guided-mode resonant grating toward the upper surface side and a phase of the second light guided in the guided-mode resonant grating and diffracted by the diffraction grating elements toward the upper surface side are same,
a difference between a phase of the second light transmitted by the guided-mode resonant grating toward the lower surface side and a phase of the second light guided in the guided-mode resonant grating and diffracted by the diffraction grating elements toward the lower surface side are $\pi$, and
a periodic number of the diffraction grating elements is 5 or more.

2. The device according to claim 1, wherein the guided-mode resonant grating includes a diffraction grating.

3. The device according to claim 2, wherein the diffraction grating includes five or more periods.

4. The device according to claim 2, wherein the diffraction grating is arranged in a dotted pattern in a direction generally parallel to a major surface of the substrate.

5. The device according to claim 2, wherein the diffraction grating is arranged in a grid in a direction generally parallel to a major surface of the substrate.

6. The device according to claim 2, wherein a cross section of the diffraction grating in a direction generally parallel to a major surface of the substrate has a circular shape.

7. The device according to claim 2, wherein the diffraction grating includes a hole portion arranged in a planar plate.

8. The device according to claim 1, wherein the color filter is made of an inorganic material.

9. The device according to claim 1, wherein a lens is provided above the color filter.

10. The device according to claim 1, wherein the color filter is placed immediately below a lens.

11. The device according to claim 9, wherein a light receiving section is further placed immediately below the color filter.

12. The device according to claim 10, wherein a multilayer wiring layer is further placed below the light receiving section.

13. The device according to claim 1, wherein an optical waveguide is placed between a lens and the color filter.

14. A solid-state imaging device comprising:
a substrate including a light receiving section; and
a color filter provided directly on the light receiving section, the color filter including a guided-mode resonant grating made of a semiconductor material, wherein
at least one of an upper surface and a lower surface of the guided-mode resonant grating is covered with a layer made of an insulating material, and the layer has a lower refractive index than the guided-mode resonant grating,
the guided-mode resonant grating has a planar section and a diffraction grating section, d (μm) means a height of the planar section, h (μm) means a height of the diffraction grating section, and W (μm) means a width of a protrusion of the diffraction grating section, a transmittance of light in a blue wavelength range is high when h is 0.04 μm, d is 0 μm, and W is 0.16 μm, a transmittance of light in a green wavelength range is high when h is 0.04 μm, d is 0.1 μm, and W is 0.12 μm, and a transmittance of light in a red wavelength range is high when h is 0.1 μm, d is 0 μm, and W is 0.16 μm.

* * * * *